United States Patent
Jeunink et al.

(10) Patent No.: US 7,652,749 B2
(45) Date of Patent: Jan. 26, 2010

(54) SOFTWARE UPGRADES IN A LITHOGRAPHIC APPARATUS

(75) Inventors: Andre Bernardus Jeunink, Bergeyk (NL); Antonius Johannes De Kort, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 627 days.

(21) Appl. No.: 11/353,231

(22) Filed: Feb. 14, 2006

(65) Prior Publication Data

US 2007/0203873 A1 Aug. 30, 2007

(51) Int. Cl.
*G03B 27/42* (2006.01)
*G03B 27/32* (2006.01)
(52) U.S. Cl. .......................... 355/53; 355/77
(58) Field of Classification Search .................. 355/53, 355/77; 250/548
See application file for complete search history.

(56) References Cited

U.S. PATENT DOCUMENTS 7,227,656 B1 * 6/2007 Kato .......................... 358/1.15

* cited by examiner

*Primary Examiner*—Hung Henry Nguyen
(74) *Attorney, Agent, or Firm*—Pillsbury Winthrop Shaw Pittman LLP

(57) ABSTRACT

The present invention relates to the activation of a software upgrade in a lithographic apparatus that transfers a pattern onto a substrate. The time and date of the activation of a software upgrade is compared with the time and date of the exposure of the first layer of a substrate or of a "lot" of substrates. If the activation date and time is later than the first exposure date and time, software-functionality types is not mixed on a single lot or substrate and the old software-functionality is used for that lot or substrate. If, on the other hand, the activation date and time of the software-functionality update is earlier than the first exposure of the lot or substrate, the lot or substrate has not yet been affected by the old software-functionality and the new, updated software-functionality may be used to control the pattern transfer onto all of the substrate layers.

16 Claims, 2 Drawing Sheets

SOFTWARE UPGRADES IN A LITHOGRAPHIC APPARATUS

FIELD

The present invention relates to a lithographic apparatus and a method for manufacturing a device. Specifically, it refers to the upgrading of the software that is used to control the method of manufacture of the device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The transfer of the pattern on to the substrate is carried out by a projection system. Software is used in the control of the projection system to ensure that the pattern is aligned correctly with the substrate and with patterns already transferred onto the substrate, as well as ensuring that the pattern has the correct shape and orientation. Specifically, the software uses measurements taken by the lithographic apparatus to calculate optimal adjustments for the lithographic apparatus during exposure; and transmits those adjustments to the parts of the lithographic apparatus that make the adjustments. The adjustments may be the settings of a lens, or the XY- and Z-positions or tilt of the substrate, substrate holder or substrate table. There is also a calibration state associated with the software to ensure that the software is calibrated with the projection system and the rest of the lithographic apparatus(es) to which the software is associated.

This software is frequently upgraded or changed. A change in the software may be in order to create a different pattern on the substrate, or to fix bugs in old software; an upgrade of the software may be to create a more efficient pattern transfer process, for example. Often, the bug fixes involve a slight change in XY positioning (i.e. in the plane of the substrate) or in Z-direction height or tilt of the substrate (usually because the bug itself was a misalignment in positioning as a result of any parts of the lithographic apparatus such as an alignment laser, etc.) The person skilled in the art will be aware of a multitude of reasons why the software controlling the projection system may be upgraded or changed.

It is desirable that software upgrades or changes be timed so that software upgrades do not occur in between the radiation of different layers on the same substrate; or even different substrates in the same "lot". In practice, this may be very difficult. This is because new software-functionality is likely to make the projection of a pattern onto a substrate layer different from the old software-functionality that was used for previous layers and the substrate or lot in question may effectively be ruined as the layers are likely to have overlay errors as a result of layers of one type being deposited on layers of a different type. Furthermore, it may be difficult to time the implementation of a new software functionality with the beginning of a lot of substrates on a series of machines, particularly as the machines are often at different points in a lot at any one time. This difficulty is known as a work-in-progress impact. Furthermore, old software-functionality and new software-functionality may have been calibrated slightly differently, which causes the same work-in-progress impact.

Because of this reduction in quality of-lots of substrates following a software upgrade, users of lithographic apparatus are reluctant to upgrade their software, potentially effecting their market positions.

SUMMARY

It is desirable to prevent yield decrease due to work-in-progress impact during software upgrades.

According to a first embodiment of the present invention, there is provided a lithographic apparatus including a projection system configured to project a patterned radiation beam onto a substrate; and a control system configured to control the projection system according to first software-functionality and a second software-functionality, the second software-functionality being a later activation than the first software-functionality, wherein the control system includes a first database configured to contain an activation date/time of the second software-functionality; a second database configured to contain a first exposure date/time of the substrate; and a comparator to compare the activation date/time and the first exposure date/time, and if the first exposure date/time is later than the activation date/time, the control system is configured to use the second software-functionality, and if the first exposure date/time is earlier than the activation date/time, the control system is configured to use the first software-functionality.

According to an embodiment of the present invention, there is provided a device manufacturing method including transferring a pattern from a patterning device onto a substrate according to parameters of a first software-functionality and a second software -functionality installed later than a first software-functionality, the method including recording a first exposure date/time of the substrate; recording an activation date/time of the second software-functionality; comparing the first exposure date/time and the activation date/time, and if the first exposure date/time is later than the activation date/time, transferring the pattern according to parameters of the first software-functionality, and if the first exposure date/time is earlier than the activation date/time, transferring the pattern according to parameters of the second software-functionality.

According to an embodiment of the invention, there is provided a method of updating software-functionality in a lithographic apparatus including recording a first exposure date/time of a substrate; recording an activation date/time of the software-functionality update; comparing the first exposure date/time and the activation date/time, and if the first exposure date/time is later than the activation date/time, using software-functionality previously installed on the lithographic apparatus, and if the first exposure date/time is earlier than the activation date/time, using the updated software-functionality.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
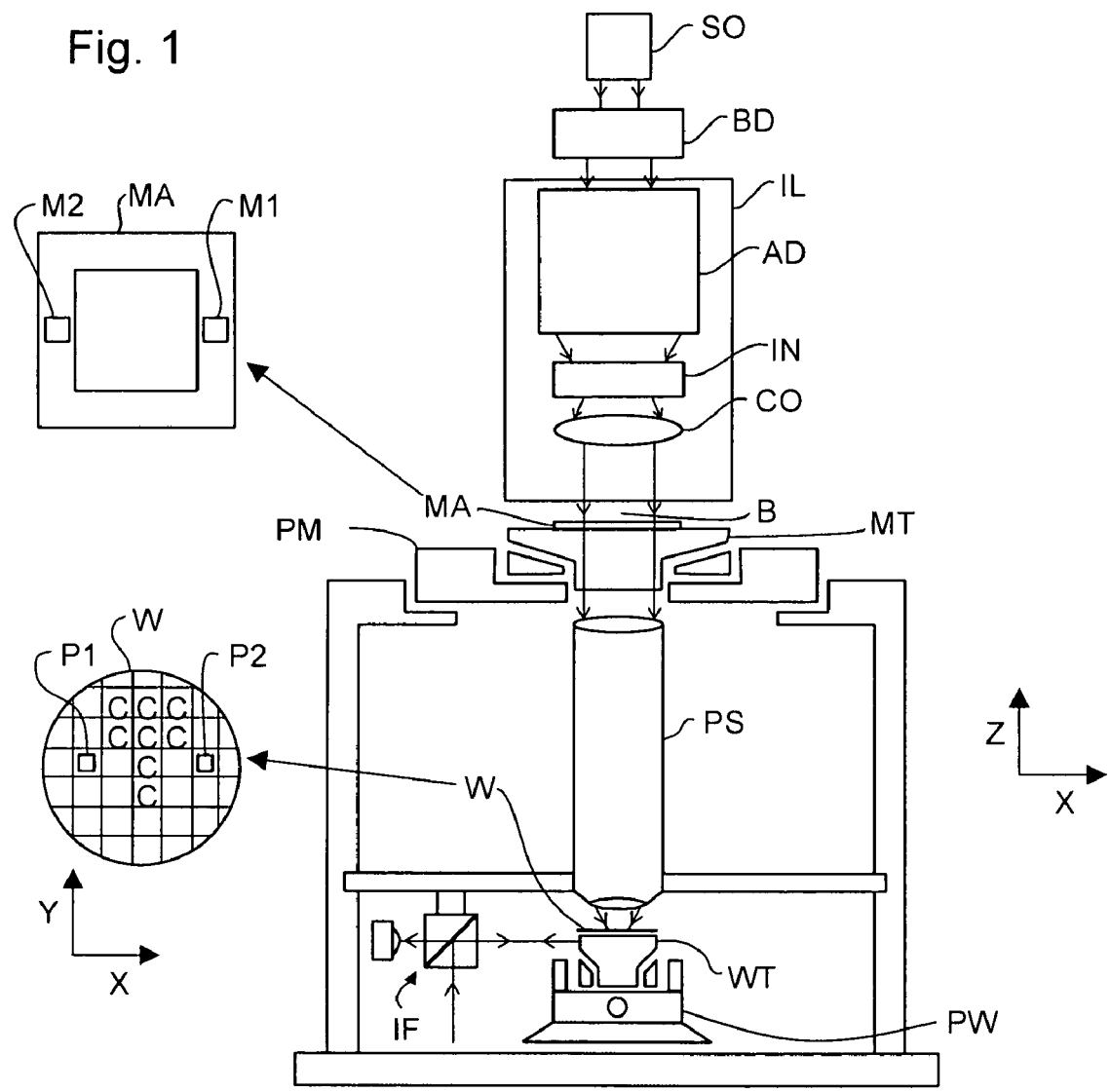
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to address difficulties related to work-in-progress impact during software upgrades, an embodiment of the present invention allows the retention of old software-functionality at the same time as installing new software-functionality and it also allows the ability to continue using the old software-functionality for substrates for which a first layer has already been exposed under the control of the old software-functionality, but at the same time allowing substrates for which the first layer has not yet been exposed, to be exposed under control of the new software-functionality. As well as the old code being kept, the old calibration state is also kept so that the old calibration state is also used for substrates for which a first layer has been exposed using the old code. In practice, when a software upgrade is carried out, the old software is replaced with the new software (i.e. binaries and/or libraries in software distribution are replaced with binaries and/or libraries generated by the new software), but the new software retains the old software-functionality until that functionality becomes redundant. Although this is the preferred method, it is possible in an embodiment to retain not only the old software-functionality, but also the old software (in the form of binaries and/or libraries) when installing the new software.

In this way, all subsequent layers exposed on to "old" substrates after the software upgrade can be dealt with in exactly the same way as before the software upgrade. Once the "old" substrates have been fully exposed, the old software-functionality and old calibration state will be defunct and can be removed from the system.

Rather than keeping track of which substrates have had a first layer exposed under the control of old software-functionality, the substrates are divided into "lots" and so a lot considered as "new" or "old" relative to a software-functionality release (or a software-functionality "patch" within a release) date and time. The activation time of the new software-functionality can be known as the "SW-activation-date/time". This date/time can be set manually by the person responsible for the software-rollout in the fab. It can be set to any time desired by the responsible person. Alternatively the date/time may be set automatically; particularly where all lithographic apparatuses in a particular group or cluster have the same software update. This "SW-activation-date/time" can be made available to all lithographic apparatuses functioning in the same system and under control of the same software. For example, a central database may be used to control a series of lithographic apparatuses (such as 42, 44 and 46 in FIG. 2).

The benefit of this method is that the introduction of software-functionality no longer causes work-in-progress difficulties. The user of the software therefore no longer has a decrease of yield after a new release of software-functionality, which increases overall throughput and saves money. Furthermore, the user of the lithographic apparatus is therefore more inclined to introduce software fixes and upgrades if the benefits can been seen immediately without a decrease in yield first.

Figure 2:
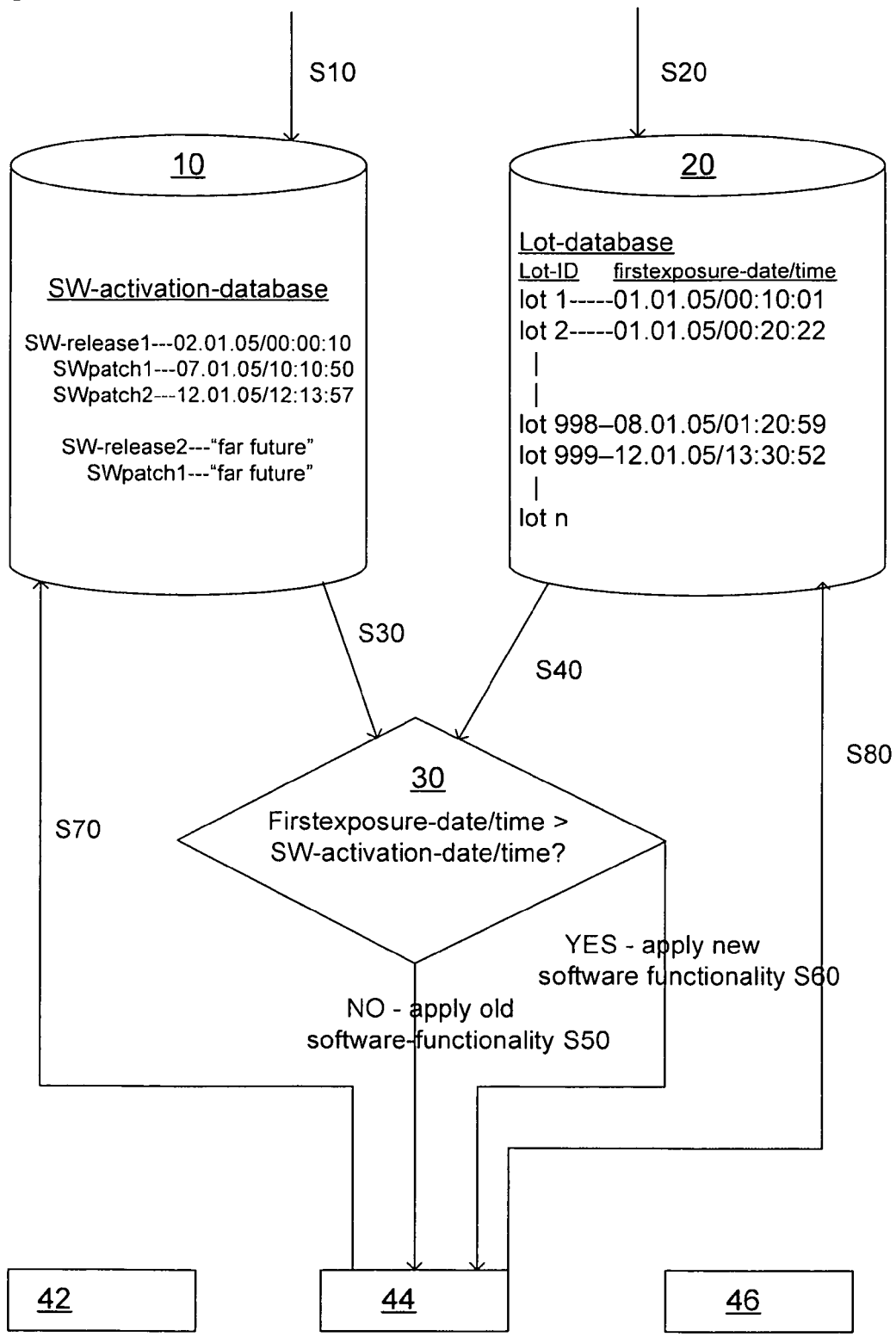
FIG. 2 depicts a flow diagram of the method of software upgrade according to an embodiment of the invention.

Turning to FIG. 2, a database 10 contains the dates and times of activation of software releases pertaining to the lithography apparatuses in questions (42, 44, 46). Database 20 contains the dates and times of the exposure of the first layer of each lot of substrates. Alternatively, in an embodiment, this database could contain the date and time of the exposure of the first layer of each substrate, but it is preferable to divide the number of substrates into lots because of the sheer numbers of substrates involved. For each new software-functionality release, the SW-activation-date/time is compared with the first exposure layer-date/time, for example in a control system 30. The input of SW-activation-date/time S30 and the input of the first exposure-date/time S40 are compared such that it is determined whether the first exposure-date/time is later than SW-activation-date/time. If the first exposure-date/time is later S60, the lot associated with that first exposure-date/time is a new lot with respect to the software-functionality release in question and so the new software-functionality and the new calibration state are used for this lot in the lithographic apparatus 44. If, on the other hand, the first exposure-date/time is not later (i.e. is earlier) than the SW-activation-date/time S50, the lot relating to that first exposure-date/time is an old lot and so the old software-functionality and the old calibration state should be used in the lithographic apparatus 44 for that lot of substrates. The lithographic apparatuses 42, 44, 46 each supply a "present lot identification" S80 and a "software release identification" and optionally "software patch identification" S70 to the lot-database 20 and SW-activation-database 10 respectively.

The dates and times of both the software-functionality releases and the first exposure of the lots can be input S10, S20 by a person responsible for the software rollout in the apparatus. The step of inputting the first exposure date and time for each lot may be done manually S20 or automatically S80. Generally, the lot-ID will be input manually, but the date/time of the first exposure of a lot will be easily done automatically. Specifically, when a lithographic apparatus receives a new lot of substrates, it accesses a new lot database. If the current lot ID is not available in the database, the present exposure must be the first layer exposure, and so the current date/time can be input in the database as the first layer exposure of that lot.

A further benefit of introducing the step of adding a date and time to an SW-activation-database is that a user of the lithographic apparatus will have control over what date and time the software-functionality of the patch/release is officially activated.

In an embodiment, setting the "SW-activation-date/time" from a "far future" date/time to a current date/time should only be carried out when all of the lithographic apparatuses in a group operated by the same software actually have the software installed and are enabled for the new calibration.

No monitoring of which lots are old and which lots are new is required; all that is desired is that a date and time of the first exposure of a substrate or a lot is inserted in to the first exposure-database 20, either manually or automatically in step S20 or S80.

After an amount of time, the old code will no longer need to be executed because the old lots will all have been fully exposed. At this point, the old code may be removed and the new code always executed on all the substrates and all the lots. This software is thereby "cleaned up" as an old code does not need to be kept for longer than is necessary.

The step of providing the first exposure-date/time may be carried out by a fab-automation-system, which may already be in place in known lithographic apparatuses. If there is no such automation system in place, the relevant dates and times may be inputted manually. The comparison between this and the SW-activation-date/time may be carried out automatically by the lithography apparatuses individually.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   (a) a projection system configured to project a patterned radiation beam onto a substrate; and
   (b) a control system configured to control said apparatus according to a first software-functionality and a second software-functionality, the second software-functionality being a later activation than the first software-functionality, the control system comprising
      (i) a first database configured to contain an activation date/time of said second software-functionality;
      (ii) a second database configured to contain a first exposure date/time of said substrate; and
      (iii) a comparator to compare the activation date/time and the first exposure date/time,
   wherein if the first exposure date/time is later than the activation date/time, the control system is configured to use said second software-functionality, and if the first exposure date/time is earlier than the activation date/time, the control system is configured to use said first software-functionality.

2. An apparatus according to claim 1, wherein each of the first and the second software-functionality comprises a parameter and a calibration state determined by that functionality.

3. A device manufacturing method comprising:
 transferring a pattern from a patterning device onto a substrate according to a first software-functionality or a second software-functionality installed later than a first software-functionality;
 recording a first exposure date/time of said substrate;
 setting an activation date/time of said second software-functionality; and
 comparing said first exposure date/time and said activation date/time,
 wherein if said first exposure date/time is later than said activation date/time, the transferring includes transferring said pattern according to said second software-functionality, and if said first exposure date/time is earlier than said activation date/time, the transferring include transferring said pattern according to said first software-functionality.

4. A method according to claim 3, wherein transferring the pattern according to a first software-functionality or a second software-functionality comprises using a parameter determined by that functionality.

5. A method according to claim 3, wherein the recording includes recording a predetermined number of lots of substrates.

6. A method according to claim 3, further comprising setting first exposure dates/times of a plurality of substrates and setting activation dates/times of a plurality of software-functionality updates and using one of the plurality of software-functionality updates with one of the plurality of substrates only if the activation date/time of the one of the plurality of software-functionality updates is earlier than the first exposure date/time of the one of the plurality of substrates.

7. A method according to claim 3, wherein the activation date/time of the software-functionality is set manually.

8. A method according to claim 3, wherein the activation date/time of the software-functionality is set automatically.

9. A method according to claim 3, wherein the activation date/time of the software-functionality is the same for a plurality of lithographic apparatuses running a same software.

10. A method according to claim 3, wherein the first exposure date/time of the substrate is recorded automatically from a substrate exposure system.

11. A method according to claim 3, wherein the first exposure date/time of the substrate is recorded manually.

12. A method according to claim 3, wherein the software-functionality is configured to calculate optimal adjustments during exposure of a lithographic apparatus based on measurements; and causing the lithographic apparatus to make those adjustments.

13. An apparatus according to claim 1, wherein the control system is configured to concurrently retain the first software-functionality and the second software functionality.

14. An apparatus according to claim 1, wherein the control system is configured to concurrently retain the first software-functionality and the second software functionality until at least a time when the first exposure date/time is past the activation date/time.

15. A method according to claim 3, comprising concurrently retaining the first software-functionality and the second software-functionality.

16. A method according to claim 3, comprising concurrently retaining the first software-functionality and the second software-functionality until at least a time when the first exposure date/time is past the activation date/time.

* * * * *